United States Patent
Zhang (10) Patent No.: US 10,032,905 B1
(45) Date of Patent: Jul. 24, 2018

(54) INTEGRATED CIRCUITS WITH HIGH VOLTAGE TRANSISTORS AND METHODS FOR PRODUCING THE SAME

(71) Applicant: Globalfoundries Singapore Pte. Ltd., Singapore (SG)

(72) Inventor: Guowei Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/468,188

(22) Filed: Mar. 24, 2017

(51) Int. Cl.
| | |
|---|---|
| *H01L 29/78* | (2006.01) |
| *H01L 29/06* | (2006.01) |
| *H01L 29/10* | (2006.01) |
| *H01L 29/08* | (2006.01) |
| *H01L 21/8234* | (2006.01) |
| *H01L 27/088* | (2006.01) |
| *H01L 29/66* | (2006.01) |

(52) U.S. Cl.
CPC .. *H01L 29/7824* (2013.01); *H01L 21/823418* (2013.01); *H01L 27/088* (2013.01); *H01L 29/0653* (2013.01); *H01L 29/0865* (2013.01); *H01L 29/0869* (2013.01); *H01L 29/0882* (2013.01); *H01L 29/0886* (2013.01); *H01L 29/1095* (2013.01); *H01L 29/66681* (2013.01)

(58) Field of Classification Search
CPC ........... H01L 29/7824; H01L 29/66681; H01L 27/088
See application file for complete search history.

(56) References Cited

U.S. PATENT DOCUMENTS

| | | | |
|---|---|---|---|
| 8,236,640 B2 * | 8/2012 | Smith ................ | H01L 29/0653 257/E21.417 |
| 2017/0125584 A1 * | 5/2017 | Zhang ............... | H01L 21/26513 |

* cited by examiner

*Primary Examiner* — Julia Slutsker
(74) *Attorney, Agent, or Firm* — Lorenz & Kopf, LLP (57) ABSTRACT

Integrated circuits and methods of producing integrated circuits are provided. In an exemplary embodiment, an integrated circuit includes a substrate and a gate overlying the substrate. A drain is defined within the substrate, where the drain and the gate are separated by a drain distance. A source is defined within the substrate adjacent to the gate, wherein the source is divided into two or more source sections.

20 Claims, 7 Drawing Sheets

INTEGRATED CIRCUITS WITH HIGH VOLTAGE TRANSISTORS AND METHODS FOR PRODUCING THE SAME

TECHNICAL FIELD

The technical field generally relates to integrated circuits with high voltage transistors and methods of producing the same, and more particularly relates to integrated circuits with high voltage transistors with reduced resistance in the "on" mode compared to traditional high voltage transistors, and methods of producing the same.

BACKGROUND

High voltage transistors are often used as a switch, where the transistor has a high resistance that essentially blocks current in the "off" mode and a lower resistance that allows current in the "on" mode. The transistor has some resistance in the "on" mode, sometimes referred to as the resistance from drain to source in the "on" mode (Rdson.) The lower the Rdson, the less voltage drop across the transistor and more efficient the operation of the transistor. Higher Rdson values typically result in higher energy losses during switching from the "on" to the "off" mode, or vice versa, as compared to transistors with lower Rdson values.

A typical transistor in an integrated circuit includes a gate electrode as a control electrode overlying a channel of a semiconductor substrate. Spaced-apart source and drain regions are on opposite sides of the channel, and current can flow between the source and drain within the channel. A gate insulator is disposed between the gate electrode and the channel of the semiconductor substrate to electrically isolate the gate electrode from the substrate. A control voltage applied to the gate electrode controls the flow of current through the channel between the source and drain regions, where the control voltage can be used to turn the transistor on or off when used as a switch. A high voltage transistor may increase the distance between the drain and the gate, where a drain distance is the distance between the drain and the gate. Longer drain distances typically produce higher the current capacities due to lower substrate current for a high voltage transistor (compared to shorter drain distances with the same dopant level and design), but longer drain distances also tend to increase the Rdson. The resistance between the gate and the drain (sometimes referred to as the "drift" region) is typically higher than the resistance between the source and the drain for a high voltage transistor, so the resistance in the drift region is the major contributor to the Rdson. Reducing the drain distance or increasing the dopant level in the drift region can reduce the resistance in the drift region, but this also reduces the breakdown voltage of the high voltage transistor, which reduces reliability.

Accordingly, it is desirable to provide integrated circuits with high voltage transistors that have decreased Rdson values with comparable or superior reliability as compared to traditional high voltage transistors, and methods of producing the same. In addition, it is desirable to provide integrated circuits with high voltage transistors that are capable of transferring high currents without damage and with reduced voltage drop as compared to traditional high voltage transistors, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing integrated circuits are provided. In an exemplary embodiment, an integrated circuit includes a substrate and a gate overlying the substrate. A drain is defined within the substrate, where the drain and the gate are separated by a drain distance. A source is defined within the substrate adjacent to the gate, wherein the source is divided into two or more source sections.

An integrated circuit is provided in another embodiment. The integrated circuit includes a substrate, a source defined within the substrate, and a drain defined within the substrate. A gate overlies the substrate between the source and the drain, where the gate and drain are separated by a drain distance. The gate includes a gate extension extending over the substrate and away from the drain.

A method of producing an integrated circuit is provided in yet another embodiment. The method includes forming a gate overlying a substrate, where the gate includes a gate extension. A drain is formed within the substrate, where a drain distance separates the drain from the gate. A source is formed within the substrate adjacent to the gate such that the source and drain are on opposite sides of the gate. The gate extension divides the source into a plurality of source sections.

BRIEF DESCRIPTION OF THE DRAWINGS

The present embodiments will hereinafter be described in conjunction with the following drawing figures, wherein like numerals denote like elements, and wherein:

FIGS. 8, 9, and 10 illustrate cross sectional views of the embodiment illustrated in FIG. 7, where FIG. 8 is taken along plane 8, FIG. 9 is taken along plane 9, and FIG. 10 is taken along plane 7.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
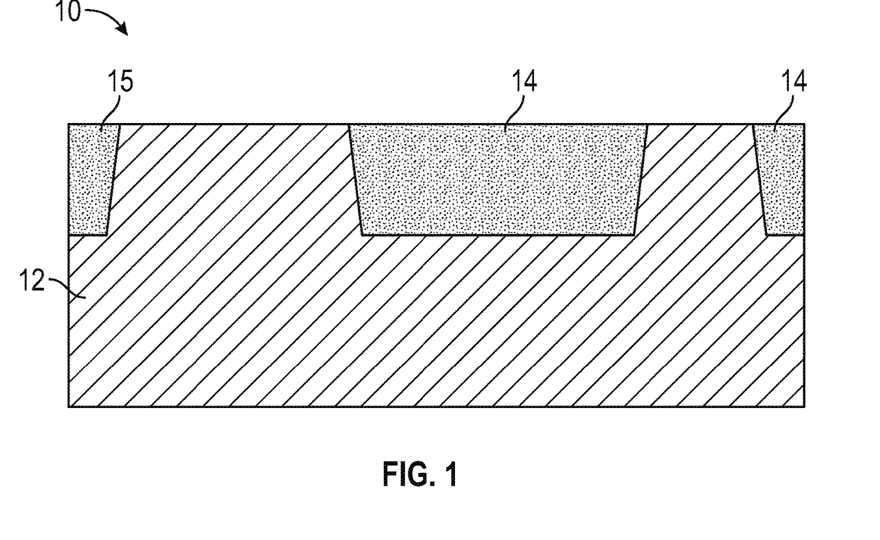
FIGS. 1-4, and 6 illustrate, in cross sectional views, exemplary embodiments of an integrated circuit and methods for producing the same.

Referring to an exemplary embodiment in FIG. 1, an integrated circuit 10 includes a substrate 12, where the substrate 12 includes semiconductor material. As referred to herein, a material that "includes" a recited element/compound includes the recited element/compound in an amount of at least 10 weight percent or more based on the total weight of the material unless otherwise indicated. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the substrate 12 primarily includes a monocrystalline silicon material. The substrate 12 may be a bulk silicon wafer (as illustrated) or may be a layer of silicon on an insulating layer (commonly known as silicon-on-insulator or SOI, illustrated in FIG. 10) that, in turn, is supported by a handle layer.

The integrated circuit 10 includes a shallow trench isolation structure 14 in an exemplary embodiment. The shallow trench isolation structure 14 includes an electrically insulating material, such as silicon dioxide, silicon nitride, silicon oxynitride, or other insulating materials. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from about more than $1 \times 10^{-4}$ ohm meters to less than about $1 \times 10^4$ ohm meters. The shallow trench isolation structure 14 may include a source shallow trench isolation structure 15 in some embodiments.

The shallow trench isolation structures 14 may be formed within the substrate 12, so some of the substrate is between adjacent shallow trench isolation structures 14. In some embodiments, the shallow trench isolation structures 14 extend some distance into the substrate 12, but do not pass through the substrate 12, such that at least a portion of the substrate 12 underlies the shallow trench isolation structures 14. As used herein, the term "overlying" means "over" such that an intervening layer may lie between the substrate 12 and the shallow trench isolation structure 14, or "on" such that the substrate 12 physically contacts the shallow trench isolation structure 14. Moreover, the term "directly overlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to a surface of the semiconductor substrate 12.

Figure 2:
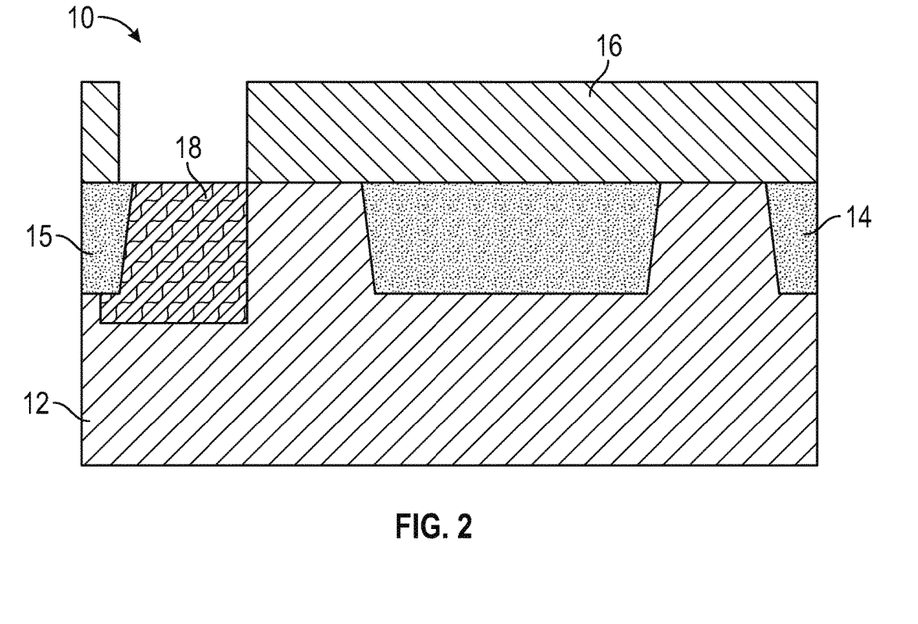

Referring to FIG. 2, a source well photoresist layer 16 is formed and patterned overlying the substrate 12. The source well photoresist layer 16 (and other photoresist layers described below) may be deposited by spin coating, and patterned by exposure to light or other electromagnetic radiation through a mask with transparent sections and opaque sections. The light causes a chemical change in the photoresist material such that either the exposed portion or the non-exposed portion can be selectively removed. The desired locations may be removed with an organic solvent, and the source well photoresist layer 16 remains overlying the other areas of the substrate 12. The source well photoresist layer 16 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

A source well 18 may then be formed in the areas exposed by the source well photoresist layer 16. In an exemplary embodiment, the source well 18 is formed by implanting conductivity determining impurities into the substrate 12. In an exemplary embodiment, "P" type conductivity determining impurities are implanted into the substrate 12 under the influence of an electrical field to produce the source well 18. "P" type conductivity determining impurities primarily include boron, aluminum, gallium, and indium, but other materials can also be used. The substrate 12 may primarily include the same type of conductivity determining impurity as that implanted into the source well 18, where the substrate 12 has a lower concentration of such conductivity determining impurity than the source well 18. The production of an "N" type transistor is described herein, but it is to be understood that a "P" type transistor may be formed instead, where a "P" type transistor has the opposite type of conductivity determining ions for the various components as described herein. For example, for a "P" type transistor, the source well 18 is implanted and primarily includes "N" type conductivity determining impurities. "N" type conductivity determining impurities primarily include phosphorous, arsenic, and/or antimony, but other materials can also be used. The source well 18 may be adjacent to the source shallow trench isolation structure 15 and the source well 18 may directly underlie at least a portion of the source shallow trench isolation structure 15 in some embodiments. The source well photoresist layer 16 may be removed after use, such as with an oxygen containing plasma.

Figure 3:
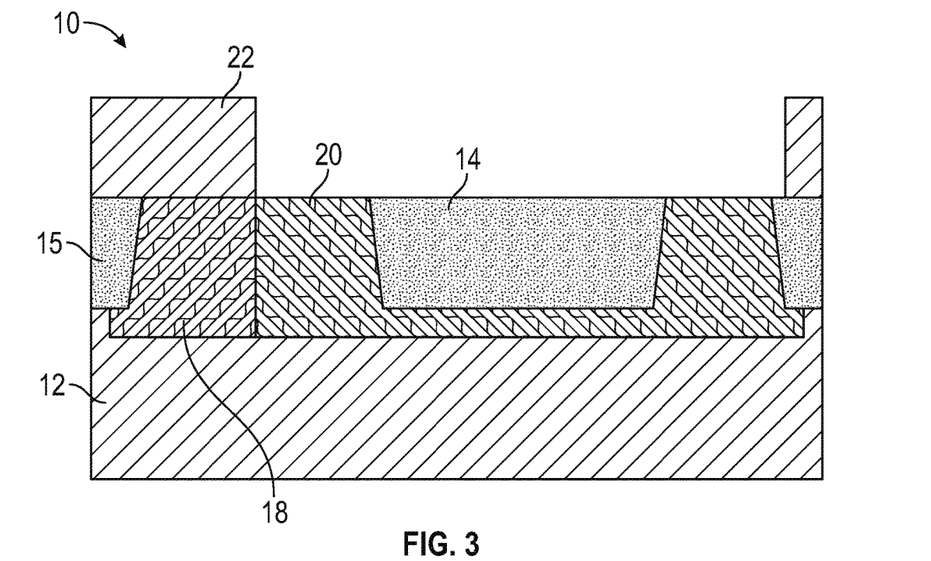

A drift well 20 is formed within the substrate 12, as illustrated in an exemplary embodiment in FIG. 3. The drift well 20 may be positioned with a drift well photoresist layer 22, which can be formed and patterned as described above. The drift well 20 may primarily include "N" type conductivity determining impurities in the example "N" type high voltage transistor described and illustrated herein. The drift well 20 may be formed by implanting ions of the desired type into the substrate 12 at the desired location. The drift well 20 may be positioned on at least two opposites sides of a shallow trench isolation structure 14 in some embodiments, and may underlie that shallow trench isolation structure 14 as well.

Figure 4:
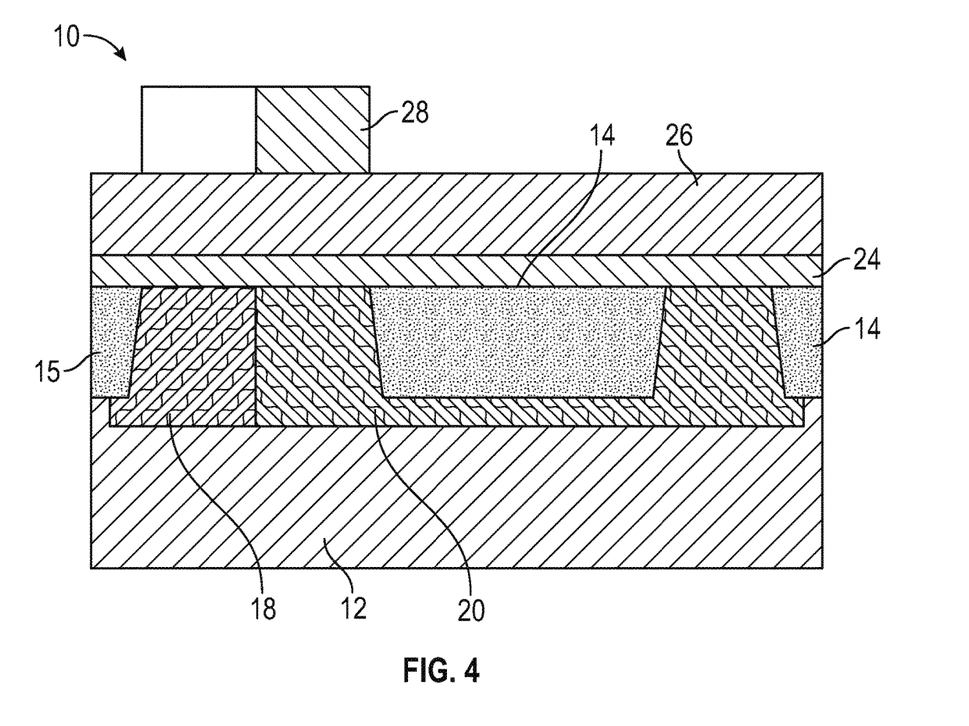

Referring to the exemplary embodiment illustrated in FIG. 4, a gate insulating layer 24 is formed overlying the substrate 12, where the gate insulating layer 24 is an electrically insulating material. The gate insulating layer 24 may be formed by thermal oxidation of the substrate 12 in embodiments with a silicon substrate 12, but the gate insulating layer 24 may also be deposited. Silicon dioxide is an insulating material that can be deposited by chemical vapor deposition using silane and oxygen, but other insulating materials and/or deposition techniques may be used in alternate embodiments. A gate layer 26 may be formed overlying the gate insulating layer 24, where the gate layer 26 is an electrically conductive material. The gate layer 26 includes polysilicon in an exemplary embodiment, where polysilicon can be formed by low pressure chemical vapor deposition in a silane environment. The gate layer 26 may also include conductivity determining impurities at a sufficient concentration to give a desired conductivity within the gate layer 26. A gate photoresist layer 28 may then be formed and patterned overlying the gate layer 26, as described above.

Figure 5:
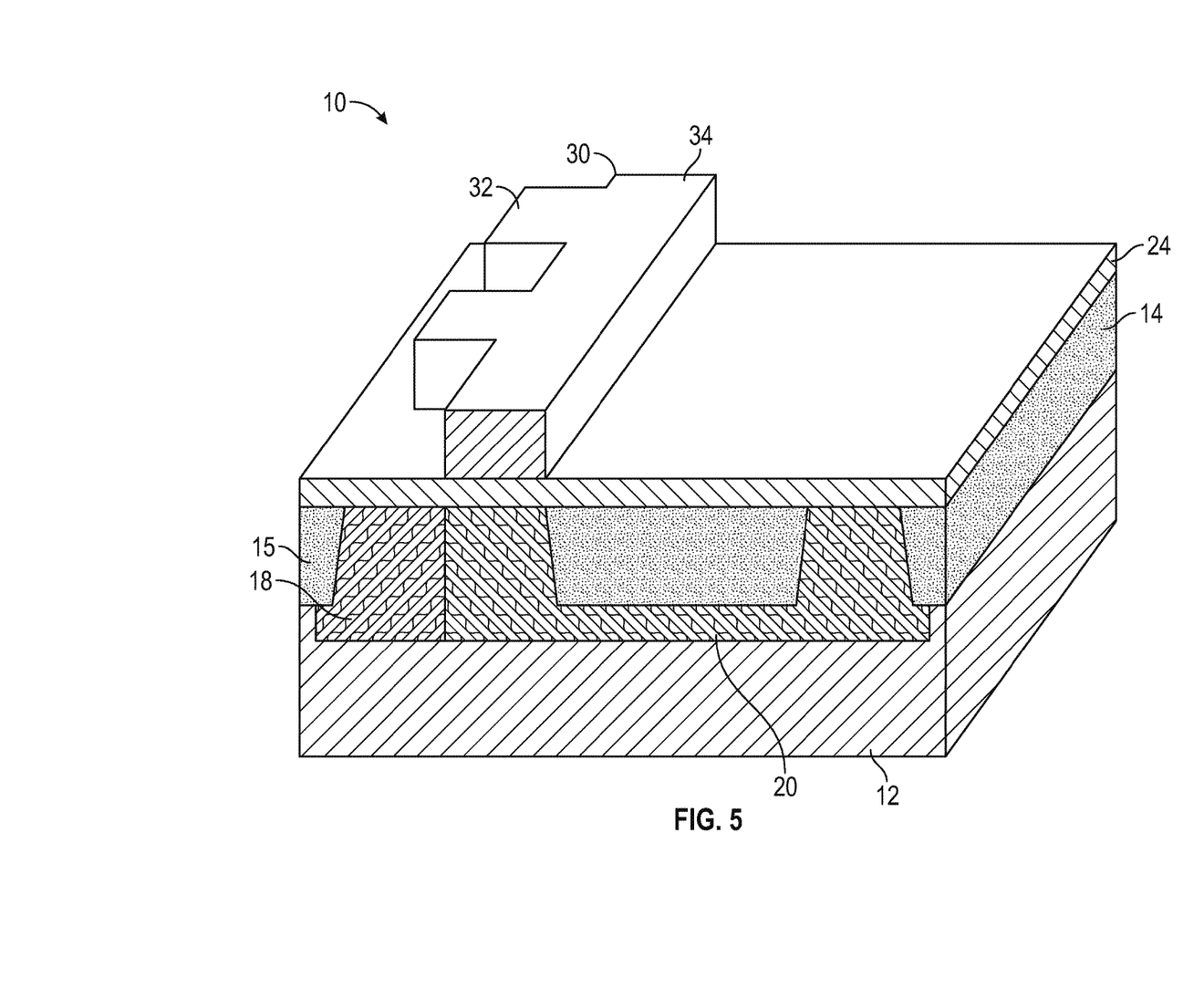
FIG. 5 illustrates a perspective sectional view of an embodiment of an integrated circuit and a method for producing the same.

A gate 30 may then be formed by removing the gate layer 26 everywhere except where covered by the gate photoresist layer 28, as illustrated in an exemplary embodiment in FIG. 5 with continuing reference to FIG. 4. A channel 48 is defined within the substrate 12 directly underlying the gate 30. The gate layer 30 may be selectively removed with a reactive ion etch using hydrogen bromide, but other techniques or etchant compounds may be used in alternate embodiments. The gate 30 includes an optional gate extension 32, where the gate extension 32 is a portion of the gate 30 that extends to a point that directly overlies at least a portion of the source shallow trench isolation structure 15. The gate 30 may include a rectangular gate body 34 (when viewed from the top) with one or more gate extensions 32 protruding from the gate body 34 in some embodiments, but the gate body 34 may have an oval shape or other shapes in alternate embodiments. The gate extension 32 may protrude from the gate body 34 such that the gate extension 32 directly overlies (i) a portion of the source well 18 and (ii) a portion of a source shallow trench isolation structure 15, but the gate body 34 may overlie areas other than the source shallow trench isolation structure 15. As such, the only portion of the gate 30 that directly overlies the source shallow trench isolation structure 15 is a portion of the gate extension 32, and not any portion of the gate body 34. The source well 18 may be positioned between the area directly underlying the gate body 34.

Figure 6:
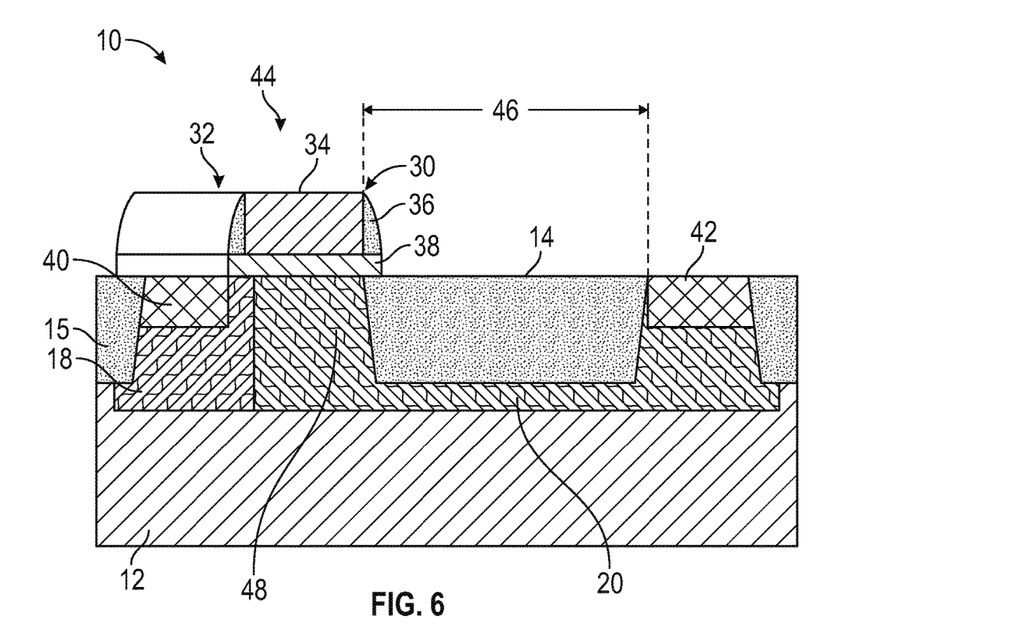

Reference is made to an exemplary embodiment illustrated in FIG. 6, with continuing reference to FIG. 5. A spacer 36 may be formed along side walls of the gate 30, including the gate extension 32 and the gate body 34, where the spacer includes an electrically insulating material. In an exemplary embodiment, silicon nitride is blanket deposited followed by an anisotropic etch of the deposited silicon nitride, which leaves the vertical portions adjacent to the gate 30 as the spacer 36. Silicon nitride may be deposited by low pressure chemical vapor deposition using ammonia and silane, and a dry plasma etch with hydrogen and nitrogen trifluoride will anisotropically remove the silicon nitride. The silicon nitride anisotropic etch is stopped when the horizontal portions of the blanket deposited silicon nitride layer are removed, but before the spacers 36 are removed. The portions of the gate insulating layer 24 that are not directly underlying the gate 30 or the spacer 36 may then be removed to form a gate dielectric 38. The exposed portion of the gate insulating layer 24 may be removed with a wet etch using dilute hydrofluoric acid, but other techniques or materials may be used in alternate embodiments.

A source 40 and a drain 42 may then be formed in the substrate 12 on opposite sides of the gate 30 by implanting conductivity determining impurities to form a high voltage transistor 44. The gate extension 32 protrudes from the gate body 34 away from the drain 42. In the exemplary embodiment described herein, the source 40 and drain 42 include "N" type conductivity determining impurities at a concentration greater than in the source well 18, where the source 40, the drain 42, and the drift well 20 predominantly include the same type of conductivity determining impurity as each other. The source 40 and drain 42 include conductivity determining impurities at a concentration greater than in the source well 18 and the substrate 12 as well. The source well 18 and the substrate 12 primarily include the same type of conductivity determining impurity as each other, and the source 40 and drain 42 primarily include a different type of conductivity determining impurity than the type in the source well 18 and the substrate 12.

The source 40 is formed in the source well 18 such that the source 40 is adjacent to the source shallow trench isolation structure 15. The portions of the substrate 12 that are covered by the gate 30, the spacer 36, and shallow trench isolation structures 14 are covered and are not part of the source 40 or the drain 42. The portions of the substrate 12 and the source well 18 that directly underlie the gate extension 32 are not formed into a portion of the source 40. The source 40 may be formed within the source well 18, as mentioned above, so the source well 18 underlies the source 40 and extends to a point such that the source well 18 underlies at least a portion of the gate 30 within the channel 48. The source 40 is in electrical communication with the channel 48 by direct contact with the channel 48 and/or through the source well 18.

The drain 42 is separated from the gate 30, or the channel 48 directly underlying the gate 30, by a drain distance 46. A shallow trench isolation structure 14 is positioned between the drain 42 and the gate 30 in the illustrated embodiment, and this shallow trench isolation structure 14 may be used to provide the desired drain distance 46 for a desired resistance (Rdson), voltage capability, and current capacity for the high voltage transistor 44. The drain 42 is in electrical communication with the channel 48 through the drift well 20 that underlies the shallow trench isolation structure 14 positioned between the drain 42 and the gate 30. The drain 42 may be formed within the drift well 20, so the drift well 20 underlies the drain 42. The drift well 20 may extend to a point such that at least a portion of the drift well 20 underlies the gate 30 within the channel 48.

Figure 7:
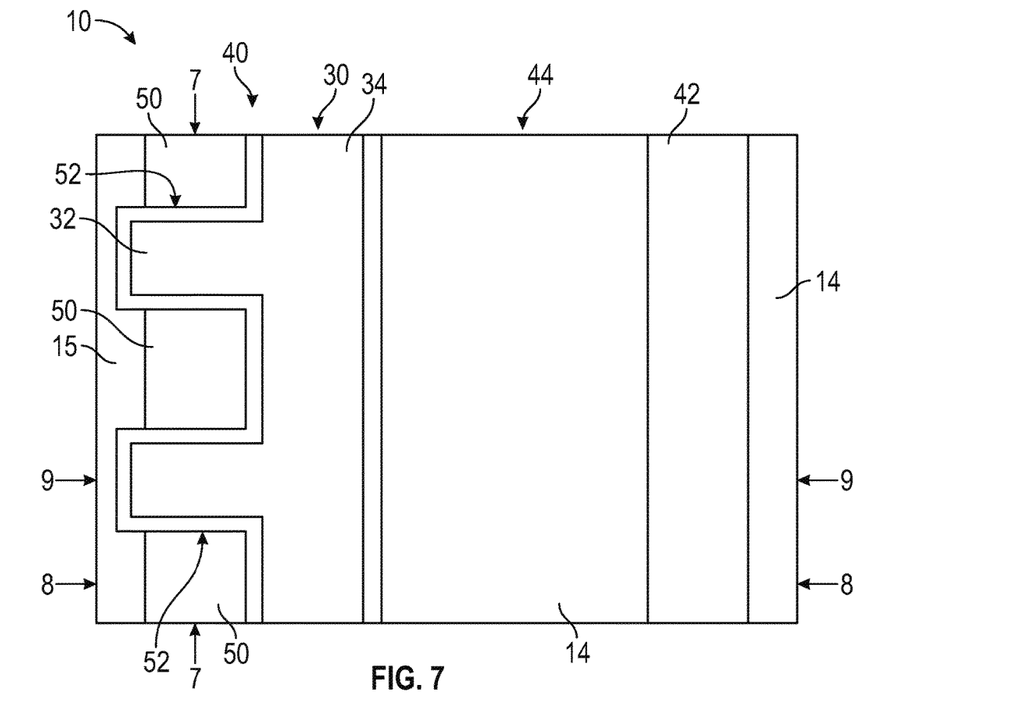
FIG. 7 illustrates a plan view of an embodiment of an integrated circuit.
Figure 8:
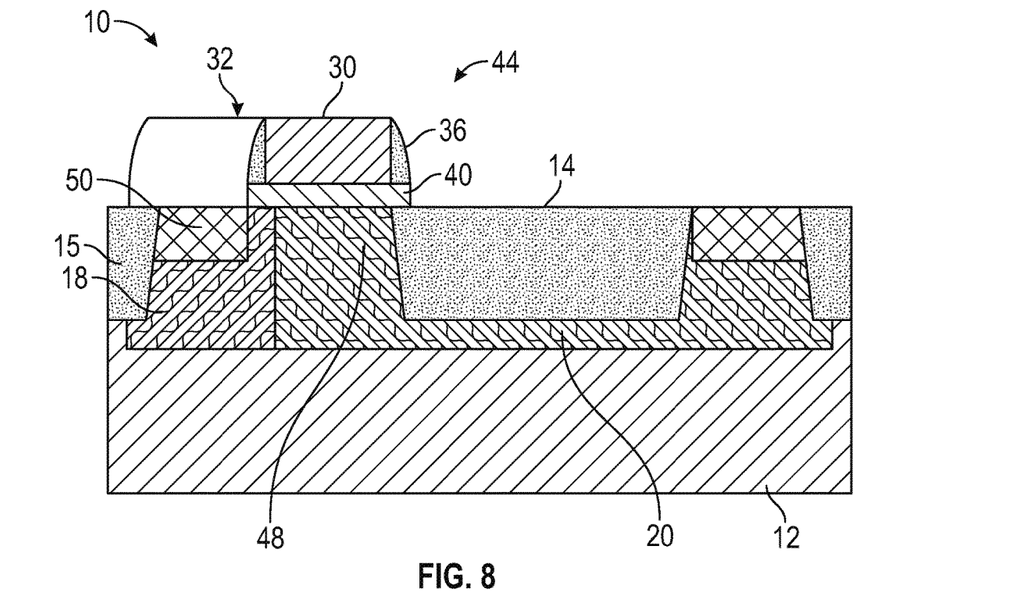
Figure 9:
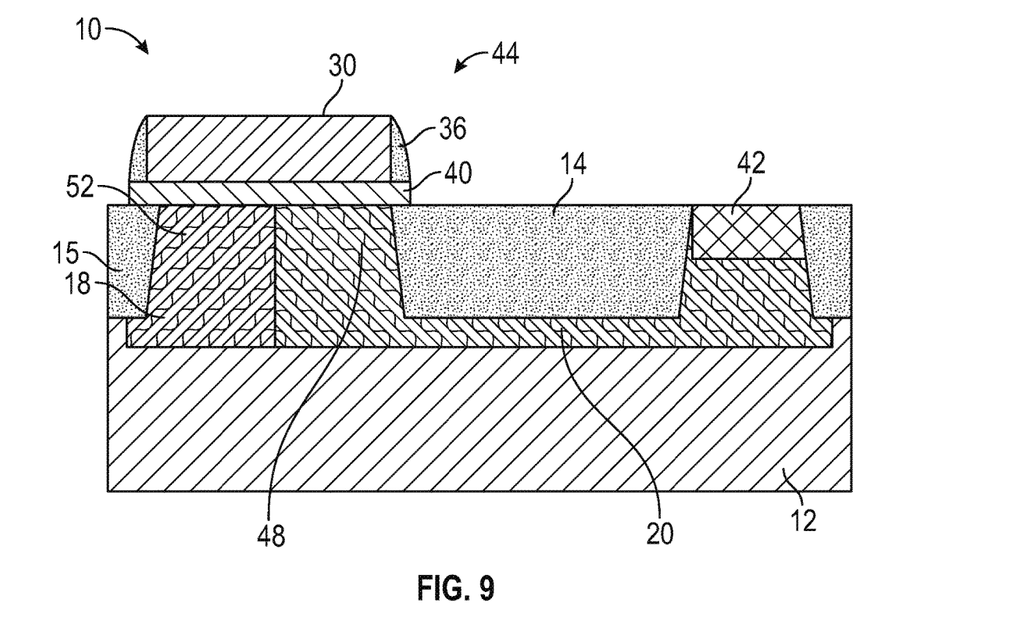
Figure 10:
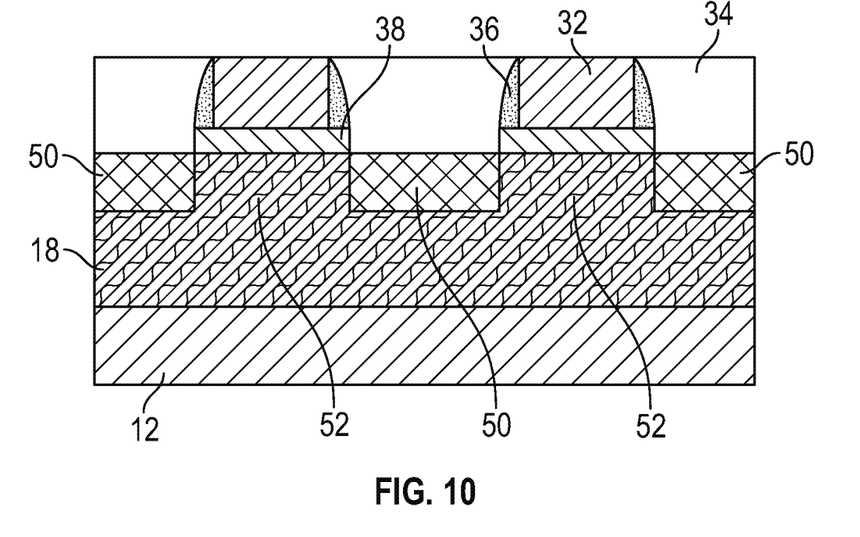
Figure 11:
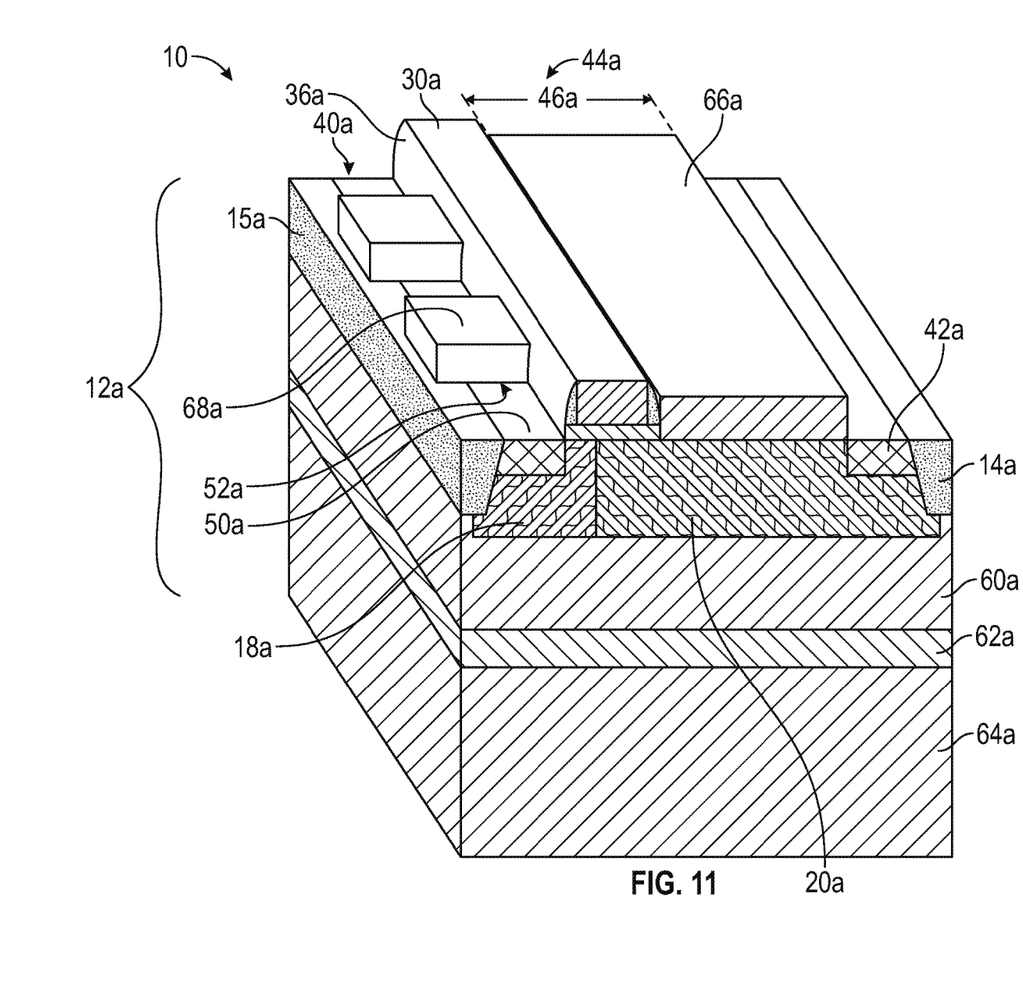
FIG. 11 illustrates a perspective sectional view of alternate embodiments of an integrated circuit.

FIG. 7 illustrates a top view, or plan view, of an exemplary embodiment of the integrated circuit 10, where FIG. 8 is a cross section taken along plane 8-8, FIG. 9 is a cross section taken along plane 9-9, and FIG. 10 is a cross section taken along plane 7-7. The source 40 is divided into two or more source sections 50 with one or more source gaps 52 positioned between adjacent source sections 50. In the illustrated embodiment, the source gap 52 is a portion of the source well 18 that directly underlies the gate extension 32, as best seen in FIG. 10. The source sections 50 can be differentiated from the source gap 52 by the concentration of conductivity determining impurities present. The source sections 50 and the source gap 52 are formed from the source well 18, but the higher concentration of conductivity determining impurities in the source sections 50 relative to the source gap 52 increases the electrical conductivity of the source sections 50 relative to the source gap 52. The source gap 52 has a lower concentration of conductivity determining impurities than the source sections 50, and may have about the same concentration of conductivity determining impurities as the source well 18 because the source gap 52 is a portion of the source well 18 that was protected from conductivity determining impurity implantation by the gate extension 32. In the illustrated embodiment, the gate extension 32 protectes the source gap 52 from implantation of conductivity determining ions when the source sections 50 are implanted. The source gap 52 reduces the area of the source 40, so a total source area that includes the area of all of the source sections 50 associated with one gate 30 is less than a total drain area, where the total drain area is the total area of the drain 42 that is associated with the same gate as the source sections 50.

It has been discovered that dividing the source into a plurality of source sections 50 that are separated by one or more source gaps 52 reduces the number of carriers and the ionization within the channel 48, which reduces the drive current within the high voltage transistor 44. This allows for a design with a shorter drain distance 46 than a comparable high voltage transistor 44 with a continuous source 40 where the source 40 and drain 42 extend adjacent to the gate 30 for about the same distance. However, because of the reduced drive current, the reliability of the high voltage transistor 44 is comparable to a similar high voltage transistor 44 with an uninterrupted source 40 and a longer drain distance 46. The reduced drain distance 46 provides a high voltage transistor 44 with a lower Rdson value without reducing the reliability of the high voltage transistor 44. The shorter drain distance 46 also produces a smaller footprint for the high voltage transistor 44. An interlayer dielectric (not illustrated) and contacts (not illustrated) may be formed to integrated the high voltage transistor 44 into other components within the integrated circuit 10.

Alternate embodiments of the high voltage transistor 44 described above are possible. FIG. 10 illustrates another embodiment with several modifications that can be implemented together or individually, where the reference numbers in FIG. 10 are differentiated from the reference numbers used above by the letter "a". Referring to FIG. 10, a high voltage transistor 44a includes an SOI substrate 12a. The SOI substrate 12a includes a working layer 60a, an insulating layer 62a, and a handle layer 64a. The working layer 60a includes a semiconductor material, as defined above. The insulating layer 62a is an electrical insulator, the working layer 60a includes a semiconductor material, and the handle layer 64a may include a semiconductor material or other types of materials in various embodiments. The working layer 60a has a source well 18a and a drift well 20a formed within the working layer 60a, where the source well 18a and the drift well 20a are between the shallow trench isolation structure 14a and the source shallow trench isolation structure 15a.

A gate 30a overlies the substrate 12a at the intersection of the source well 18a and the drift well 20a, and a silicide block 66a overlies the drift well 20a between the gate 30a and the drain 42a. The silicide block 66a is used to block salicidation and implantation into the drift well 20a such that the drain distance 46a is primarily defined by the size of the silicide block 66a (as well as the size of the spacer as the size of the spacer 36a). The source 40a is divided into a plurality of source sections 50a by a hard mask 68a, where the hard mask 68a extends over a source gap 52a of the source well 18a between the gate 30a and the source shallow trench isolation 15a. The hard mask 68a may include silicon nitride, silicon dioxide, silicon oxynitride, or other materials in various embodiments. In yet other embodiment (not illustrated), the source and drain may be formed overlying the substrate instead of being formed within the substrate. Other embodiments are also possible, such as a replacement metal gate in place of the polysilicon gate described above.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a substrate;
   a gate overlying the substrate;
   a drain defined within the substrate, wherein the drain and the gate are separated by a drain distance;
   a source defined within the substrate adjacent to the gate, wherein the source is divided into two or more source sections;
   a source gap is defined between adjacent source sections, wherein the source gap and the source sections primarily include different types of conductivity determining impurities.

2. The integrated circuit of claim 1 further comprising:
   a shallow trench isolation structure positioned between the drain and the gate.

3. The integrated circuit of claim 2 wherein at least a portion of the shallow trench isolation structure that is positioned between the drain and the gate directly underlies the gate.

4. The integrated circuit of claim 1 further comprising:
   a silicide block overlying the substrate between the drain and the gate.

5. The integrated circuit of claim 1 wherein the substrate comprises an SOI substrate, wherein the substrate comprises a working layer, an insulating layer underlying the working layer, and a handle layer underlying the insulating layer.

6. The integrated circuit of claim 1 further comprising:
   a drift well underlying the drain and at least a portion of the gate, wherein the drift well
   and the drain primarily comprise the same type of conductivity determining.

7. The integrated circuit of claim 6 further comprising:
   a source well underlying the source and the at least a portion of the gate, wherein the source well and source primarily comprise different types of conductivity determining impurities.

8. The integrated circuit of claim 7, wherein the source gap and the source well have about the same concentration of conductivity determining impurities.

9. The integrated circuit of claim 1 further comprising:
   a source shallow trench isolation structure adjacent to the source such that the gate and the source shallow trench isolation structure are positioned on opposite sides of the source.

10. The integrated circuit of claim 9 wherein the gate comprises a gate extension that extends between adjacent source sections such that at least a portion of the gate extension directly overlies the source shallow trench isolation structure and a portion of the gate extension directly overlies the source gap.

11. The integrated circuit of claim 1 wherein the gate comprises a gate body and a gate extension protruding from the gate body, wherein the gate body has a rectangular shape.

12. The integrated circuit of claim 1 wherein the two or more source sections comprise a total source area, the drain comprises a total drain area, and the total drain area is greater than the total source area.

13. The integrated circuit of claim 1 wherein the source gap has a lower concentration of conductivity determining impurities than the source section.

14. The integrated circuit of claim 1 wherein the gate comprises a gate extension, and wherein the source gap directly underlies the gate extension.

15. An integrated circuit comprising:
   a substrate;
   a source defined within the substrate, wherein the source comprises two or more source sections;
   a source gap defined between adjacent source sections, wherein the source gap and the source primarily comprise different types of conductivity determining impurities;
   a drain defined within the substrate;
   a gate overlying the substrate between the source and the drain, wherein the gate and the drain are separated by a drain distance, and wherein the gate comprises a gate extension extending over the substrate and away from the drain, and wherein the gate extension directly overlies the source gap.

16. The integrated circuit of claim 15 further comprising a source well underlying the source sections, wherein the source well and the source sections primarily comprise different types of conductivity determining impurities.

17. The integrated circuit of claim 16 wherein the source primarily comprises "N" type conductivity determining impurities, and the source gap primarily comprises "P" type conductivity determining impurities.

18. The integrated circuit of claim 15 wherein the source comprises a conductivity determining impurity at a concentration greater than that in the source gap.

19. The integrated circuit of claim 16 wherein the source well and the source gap have about the same concentration of conductivity determining impurities.

20. A method of producing an integrated circuit comprising:
   forming a gate overlying a substrate, wherein the gate comprises a gate extension;
   forming a drain within the substrate, wherein a drain distance separates the drain from the gate; and
   forming a source within the substrate adjacent to the gate such that the source and the drain are on opposite sides of the gate, wherein the gate extension divides the source into a plurality of source sections such that a source gap is defined between adjacent source sections, wherein the source sections and the source gap primarily include different types of conductivity determining impurities.

* * * * *